United States Patent
Hom et al.

(10) Patent No.: US 8,122,413 B2
(45) Date of Patent: Feb. 21, 2012

(54) TRANSPARENT TEST METHOD AND SCAN FLIP-FLOP

(75) Inventors: Pat Hom, Milpitas, CA (US); Steven Eplett, Milpitas, CA (US); Rabi Sengupta, San Jose, CA (US); Eric West, San Jose, CA (US); Lyle Smith, Santa Clara, CA (US)

(73) Assignee: Otrsotech, Limited Liability Company, Wilmington, DE (US)

( * ) Notice: Subject to any disclaimer, the term of this patent is extended or adjusted under 35 U.S.C. 154(b) by 286 days.

(21) Appl. No.: 12/303,938

(22) PCT Filed: Jun. 9, 2007

(86) PCT No.: PCT/US2007/070821
§ 371 (c)(1),
(2), (4) Date: Dec. 8, 2008

(87) PCT Pub. No.: WO2007/146849
PCT Pub. Date: Dec. 21, 2007

(65) Prior Publication Data
US 2010/0169856 A1 Jul. 1, 2010

Related U.S. Application Data

(60) Provisional application No. 60/804,283, filed on Jun. 9, 2006, provisional application No. 60/805,087, filed on Jun. 18, 2006.

(51) Int. Cl.
*G06F 17/50* (2006.01)
(52) U.S. Cl. ........................ 716/116; 716/104
(58) Field of Classification Search .................. 716/104, 716/116; 714/726
See application file for complete search history.

(56) References Cited

U.S. PATENT DOCUMENTS
5,166,604 A * 11/1992 Ahanin et al. ............. 324/750.3
(Continued)

FOREIGN PATENT DOCUMENTS
JP 63-300528 12/1988
(Continued)

OTHER PUBLICATIONS
M. Sachdev, "Testing defects in scan chains", IEEE Design & Test of Computers, vol. 12, Issue 4, pp. 45-51, 1995, See p. 48 Transparent Scan (including Figure 6-8).

(Continued)

*Primary Examiner* — Jack Chiang
*Assistant Examiner* — Eric Lee
(74) *Attorney, Agent, or Firm* — Schwabe, Williamson & Wyatt, P.C.

(57) ABSTRACT

Logic blocks for IC designs (including gate-array, standard cell, or logic array designs) provide Design-for-Test-enabled flip-flops (DFT-enabled FFs) that inherently insure compliance with DFT rules associated with scan shifting. Test scan-chains are configured by daisy-chaining instances of the logic block in a transparent (invisible) manner to user-designed application circuits, which can be designed without any user-inserted test structures or other regard for DFT considerations. User asynchronous set and reset inputs and all Stuck-At faults on all user pins on these DFT-enabled FFs are observable via capture and scan-out. A first type of these DFT-enabled FFs features addressable control to partition test the application circuit. A second type of these DFT-enabled FFs features integral capture buffering that eliminates the need for partition test, simplifying control logic and reducing the number of test vectors needed.

18 Claims, 18 Drawing Sheets

U.S. PATENT DOCUMENTS

| | | | |
|---|---|---|---|
| 5,252,917 A * | 10/1993 | Kadowaki | 714/731 |
| 6,393,592 B1 | 5/2002 | Peeters et al. | |
| 7,313,739 B2 | 12/2007 | Menon et al. | |
| 2004/0015803 A1 * | 1/2004 | Huang et al. | 716/10 |
| 2004/0041610 A1 * | 3/2004 | Kundu | 327/215 |
| 2005/0055615 A1 * | 3/2005 | Agashe et al. | 714/727 |
| 2006/0085709 A1 | 4/2006 | Kim et al. | |
| 2006/0139056 A1 * | 6/2006 | Madurawe | 326/41 |

FOREIGN PATENT DOCUMENTS

| | | |
|---|---|---|
| JP | 04-072583 | 6/1992 |
| JP | 05-341016 | 12/1993 |
| JP | 11-317429 | 11/1999 |
| JP | 2000-209074 | 7/2000 |
| JP | 2001-059856 | 6/2001 |
| KR | 1020050051856 A | 6/2005 |
| WO | PCT/JP2004/010089 * | 7/2004 |

OTHER PUBLICATIONS

International Search Report for PCT/US2007/070821 dated Nov. 7, 2007.

European Search Report, issued Apr. 19, 2011, related to Application No. EP07798355.9.

Notice of Rejection for JP Application No. 2009-514561, mailed on Sep. 30, 2011.

* cited by examiner

DFT - enabled buffers from Fig. 12

TRANSPARENT TEST METHOD AND SCAN FLIP-FLOP

CROSS REFERENCE TO RELATED APPLICATIONS

The present application is a national phase entry under 351 U.S.C. § 371 of, International Patent Application No. PCT/US07/070,821, filed Jun. 9, 2007, entitled "TRANSPARENT TEST METHOD AND SCAN FLIP-FLOP," which designates the United States of America, and which claims priority to U.S. Provisional Application Ser. Nos. 60/804,283, filed Jun. 9, 2006, and 60/805,087, filed Jun. 18, 2006. The entire content and disclosures of all foregoing applications are hereby incorporated by reference in their entireties for all purposes except for those sections, if any, that are inconsistent with the present application.

BACKGROUND

1. Field

Advancements in integrated circuit design for testability are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes. Nothing herein is to be construed as an admission that any of the references are pertinent prior art, nor does it constitute any admission as to the contents or date of actual publication of these documents.

Integrated circuit chips must be tested for manufacturing flaws. Manufacturing flaws are often modeled using fault models. The Stuck-At fault model is the most basic fault model. A Stuck-At fault occurs when a particular connection in the circuit remains at ("stuck at") a low level (known as Stuck-At 0 or SA0) or remains at ("stuck at") a high level (known as Stuck-At 1 or SA1). A SA0 fault on a connection is detected when the circuit is controlled to place a 1 (high) value on that connection, but a 0 (low) value is observed on that connection. A SA1 fault on a connection is detected when the circuit is controlled to place a 0 value on that connection, but a 1 value is observed on that connection. Circuits whose internal connections are easily controlled and observed are more testable than circuits whose internal connections are more difficult to control and observe.

Scan testing is a widely used technique to detect manufacturing defects in integrated circuits. In a scanned circuit, some or all of the flip-flops are replaced by scan flip-flops. A scanned circuit is using "full scan" if all the flip-flops are scan flip-flops; otherwise the circuit is using "partial scan". Scan provides a method of increasing the controllability and observability of a circuit.

Mux-scan is the most common method of implementing scan test. A mux-scan flip-flop has two modes: a normal operation mode and a scan shift mode. During normal operation mode, the scan flip-flops implement the user's desired (non-test mode) behavior. During scan shift mode, the scan flip-flops are interconnected into one or more shift registers (scan chains).

FIG. 1 shows a prior-art mux-scan flip-flop with asynchronous reset and asynchronous preset pins. When the SE (scan enable) pin is at a 0 value, the flip-flop is in normal operation mode. When the SE pin is at a 1 value, the flip-flop is in scan shift mode. In both normal operation mode and scan shift mode, the CLK pin is used to clock data into the flip-flop. A 0 value on the RN asynchronous pin loads the flip-flop with a 0 value. A 0 value on the SN asynchronous pin loads the flip-flop with a 1 value. The SN asynchronous preset and RN asynchronous reset pins both must remain at a 1 value during scan shift mode. Otherwise, incorrect values will be loaded into the scan chains.

Flip-flops may be designed to have reset priority (i.e., when SN and RN both have a 0 value, the flip-flop is asynchronously loaded with a 0 value). Flip-flops may also be designed to have preset priority (i.e., when SN and RN both have a 0 value, the flip-flop is asynchronously loaded with a 1 value).

By placing the scan flip-flops in scan shift mode and applying clocks, values can be loaded into the scan flip-flops (scan-in operation) and extracted from the scan flip-flops (scan-out operation). A typical scan test sequence is: scan-in, normal operation (with one or more clocks applied to the circuit), and scan-out. Circuit defects are detected when the scan-out values do not match the expected values for a good circuit. One scan test sequence can detect multiple faults.

To test a circuit, multiple scan test sequences are usually needed. Automated Test Pattern Generation (ATPG) programs usually generate the scan test sequences. The ATPG programs use the scan flip-flops as control points (values can be scanned in) and observe points (values can be scanned out) when creating scan test sequences to detect faults. In general, given two circuits that perform the same "normal operation" behavior—with one circuit using full scan and the other circuit using partial scan—ATPG programs work more effectively with the circuit that uses full scan and can generate scan test sequences capable of detecting a higher percentage of manufacturing defects.

In order to use scan testing, the circuit must obey many "design-for-test rules (DFT rules). Obeying DFT rules increases the cost and time of developing circuits. DFT rule violations must be corrected, and the designer must also verify that fixing the DFT rule violations did not introduce errors in the circuit's normal operation. Designers may choose to not fix some DFT rule violations, and therefore must replace the violating scan flip-flops with non-scan flip-flops, resulting in a partial scan design.

Designers often prototype in FPGAs, and when higher performance and/or lower cost is desired, the FPGA-based designs are converted to a gate array, logic array, or standard cell implementation. Since the FPGA devices are pre-tested, the designer usually does not consider scan and its associated DFT rules when developing the design. However, the designer is responsible for ensuring that the gate array, logic array, or standard cell implementation is tested, and usually uses scan test. At this point, obeying DFT rules can cause major changes in the design. A test methodology that is transparent to the designer while still providing the testability associated with "full scan" testability would be a major advantage for getting to market quicker.

Existing technologies such as gate arrays and new technologies such as logic arrays allow user-designed circuits to be manufactured quicker than if the user-designed circuit was implemented in standard cell. Gate arrays and logic arrays both use pre-designed logic that can be configured by routing to implement a user-design circuit. Manufacturing steps prior to customization routing can be done before the user-designed circuit has been designed.

The pre-designed logic in a gate array has usually been implemented using custom designed logic. Custom designed logic usually requires more time to design and to validate than logic implemented in standard cell.

The Modular Array, also known as structured array and more recently as a logic array, uses standard cells to implement the pre-designed logic. This technique is described in U.S. patent application Ser. No. 10/447,465, filed May 28, 2003, and published Dec. 2, 2004 as Publication No. US 2004/0243966, Modular Array Defined by Standard Cell Logic, which is owned by the owner of the instant application, and to the extent permitted by the type of the instant application, is herein incorporated by reference for all purposes. Constructing logic array building blocks from standard cells allow logic arrays to be implemented more quickly than if custom designed logic was used to implement the building blocks.

The available macros of both gate-arrays and logic arrays are implemented as a base array portion of pre-designed lower layers and a customization portion of at least one upper layer. These macros are necessarily pre-selected and pre-placed. (This is in contrast with conventional standard cell design, which permits the designer of the application circuit to make largely unrestricted selection and placement of instances of cells copied from a standard cell library.) The available macros are allocated to the corresponding functions of the application (user) circuit netlist. For gate-arrays, the macros are implemented using custom circuit design and generally are relatively primitive functions. For logic arrays, the macros are implemented using a pre-existing standard cell library (that frequently is specified by the user rather than the logic array tool vendor) and generally include both primitive and relatively higher-order functions.

Since standard cells are used to implement the logic array's pre-designed logic, mux-scan can certainly be used to test user-designed circuits. However, the designer must follow all the associated DFT rules. Providing a test method that insures effortless automatic compliance with DFT rules and is compatible with logic arrays, would make it even easier and faster for a designer to have a user-designed circuit manufactured.

Partition test is a concept described in U.S. Pat. Nos. 6,223,313 and 6,611,932, which are owned by the owner of the instant application, and to the extent permitted by the type of the instant application, are herein incorporated by reference for all purposes.

Synopsis

The invention may be implemented in numerous ways, including as a process, an article of manufacture, an apparatus, a system, a composition of matter, and a computer readable medium such as a computer readable storage medium or a computer network wherein program instructions are sent over optical or electronic communication links. In this specification, these implementations, or any other form that the invention may take, may be referred to as techniques. In general, the order of the operations of disclosed processes may be altered within the scope of the invention. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts taught described herein. As is discussed in more detail in the Conclusions, the invention encompasses all possible modifications and variations within the scope of the issued claims.

Logic blocks (macro cells) for IC designs (including gate-array, standard cell, or logic array designs) provide Design-for-Test-enabled flip-flops (DFT-enabled FFs) that inherently insure compliance with DFT rules associated with scan shifting. Test scan-chains are configured by daisy-chaining instances of the logic block in a manner transparent (invisible, hidden) to user-designed application circuits, which can be designed without any user-inserted test structures or other regard for DFT considerations. User asynchronous set and reset inputs and all Stuck-At faults on all user pins on these DFT-enabled FFs are observable via capture and scan-out. A first type of these DFT-enabled FFs features addressable control to partition test the application circuit. A second type of these DFT-enabled FFs features integral capture buffering that eliminates the need for partition test, simplifying control logic and reducing the number of test vectors needed.

Providing the DFT-enabled FF cells in a given design flow enables transparent effortless automatic compliance with DFT rules when porting a pre-existing application design (such as from an FPGA prototype) that was developed with little or no regard for testability. In some embodiments, a gate level netlist designed without observation of DFT rules is transformed in a single-pass to a gate level netlist that complies with all DFT rules, by using DFT-enabled FF cells for each application specified FF and interconnecting the DFT-enabled FF cells to form scan-chains.

According to various embodiments, the DFT-enabled FFs cells are used in gate-array, standard-cell, and logic array design flows for the design of integrated circuits (chips). In some standard-cell flows, at least one type of DFT-enabled FF is added to the standard cell library. For gate-array and logic array flows the pre-placed pre-selected set of logic macros is expanded to include at least one type of DFT-enabled FF. In some embodiments, the DFT-enabled FF macros are implemented using components from an existing standard cell library. In other embodiments, DFT-enabled FF macros are implemented as custom circuit designs.

BRIEF DESCRIPTION OF DRAWINGS

In FIG. 14, the flip-flop oscillates between 0 to 1 and 1 to 0.

DETAILED DESCRIPTION

Figure 1:
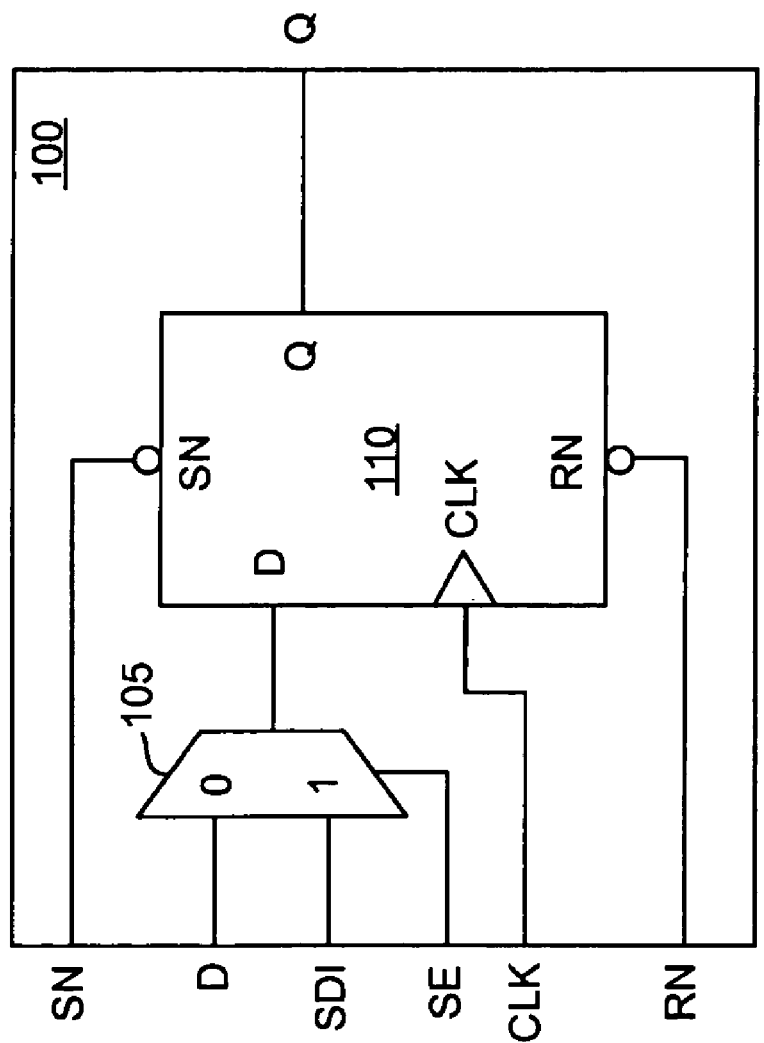
FIG. 1 shows a prior-art mux-scan flip-flop with asynchronous reset and asynchronous preset pins.

A detailed description of one or more embodiments of the invention is provided below along with accompanying figures illustrating selected details of the invention. The invention is described in connection with the embodiments. It is well established that it is neither necessary, practical, or possible to exhaustively describe every embodiment of the invention. Thus the embodiments herein are understood to be merely exemplary, the invention is expressly not limited to or by any or all of the embodiments herein, and the invention encompasses numerous alternatives, modifications and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

INTRODUCTION

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

EC1) A method for designing an integrated circuit, comprising:
  identifying the fabrication process of the integrated circuit and a process-qualified standard cell library;
  receiving a gate-level netlist specifying at least a portion of the integrated circuit including a plurality of sequential storage functions;
  programmatically mapping the gate-level netlist onto a target implementation architecture of at least the portion of the integrated circuit including implementing each sequential storage function of the netlist via a respective DFT-enabled storage circuit having integral design-for-testability functionality; and
  wherein the target implementation architecture for at least the portion of the integrated circuit specified by the netlist uses the standard cell library to implement function blocks of a logic array, the logic array having a base array portion of pre-designed lower layers and a customization portion of at least one upper layer, the function blocks being allocatable to the functions of the netlist.

EC2) The method of EC1, wherein the DFT-enabled storage circuit is a DFT-enabled flip-flop.

EC3) The method of EC1, wherein the DFT-enabled storage circuit is a DFT-enabled latch.

EC4) The method of EC3, wherein the latch is a simulated latch.

EC5) The method of EC1, wherein each sequential storage function has normal-operation pins including a clock input and at least one asynchronous control input.

EC6) The method of EC5, wherein the DFT-enabled storage circuit provides observability of all stuck-at faults on the normal-operation pins.

EC7) The method of EC1, wherein the design-for-testability functionality of the DFT-enabled storage circuit is transparent to the normal operation (i.e., non-test mode operation) of the integrated circuit.

EC8) The method of EC1, wherein at least some of the method is implemented via an EDA tool controlled by a designer.

EC9) The method of EC1, wherein the gate-level netlist was created without concern for testability and the netlist specified sequential storage functions having no integral design-for-testability functionality.

EC9) The method of EC1, wherein prior to the programmatic mapping, the gate-level netlist need not be modified to incorporate design-for-testability rules.

EC10) The method of EC1, wherein the original target implementation architecture for the netlist was a field programmable gate array.

DFT-Enabled Flip-Flops, Latches, and Buffers

DFT-enabled FF embodiments are taught herein that insure inherent compliance with the majority of the DFT rules associated with mux-scan. Further embodiments combine the DFT-enabled FF with partition test techniques to achieve testing methods that can test user-designed circuits without requiring any user-inserted test structures—in other words, the test methods are transparent to the user.

At a high-level description, the DFT-enabled FF includes logic that ensures correct scan shift mode, and also provides a novel method of observing (capturing) data.

Figure 2:
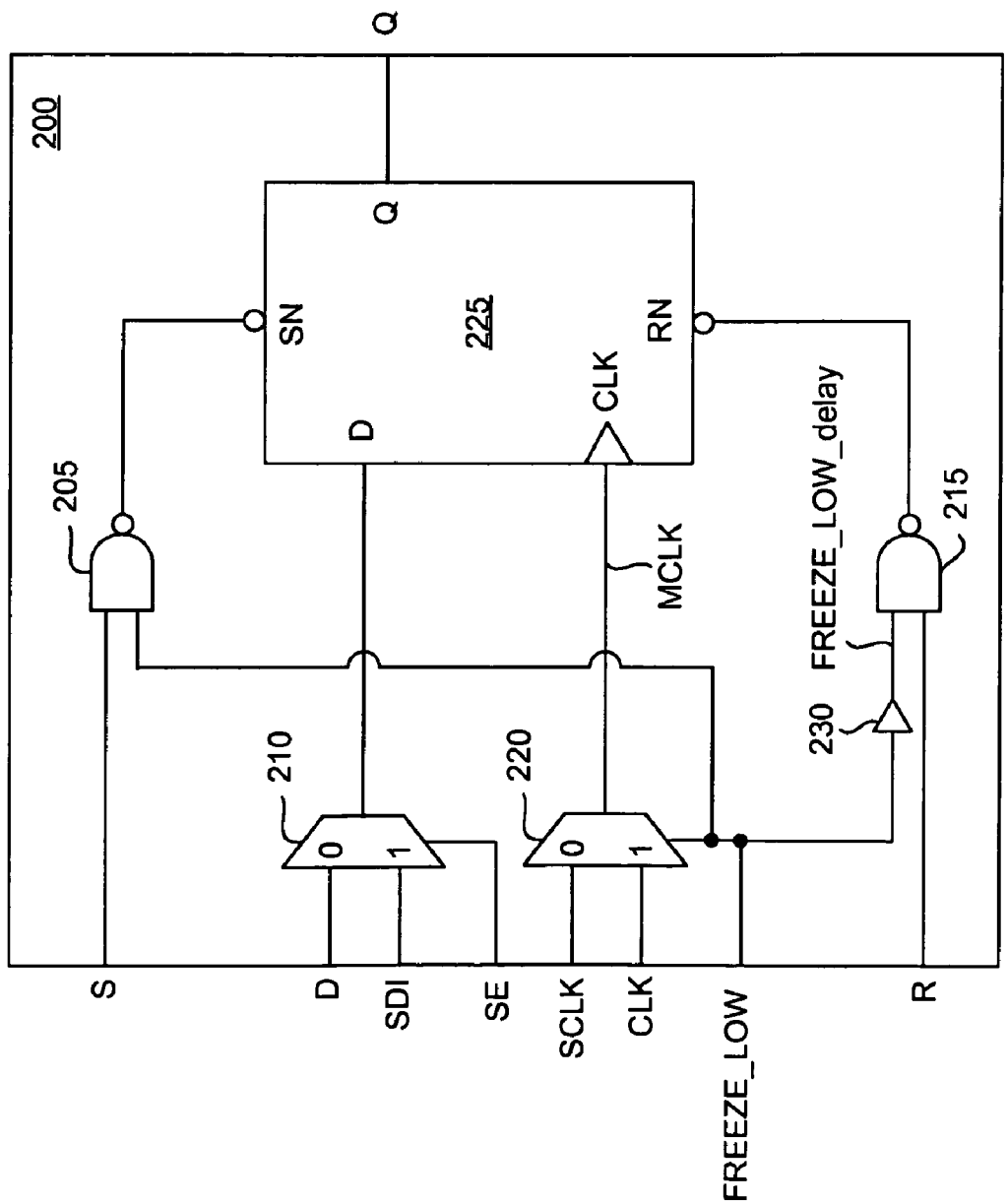
FIG. 2 shows a first DFT-enabled FF embodiment.

FIG. 2 shows an implementation of the DFT-enabled FF. The user pins are D, CLK, R, S, and Q. From a user's functional viewpoint (e.g., when the DFT-enabled FF is not in test mode), when R has a 1 value, the core flip-flop is asynchronously loaded with a 0 value. From a user's functional viewpoint (e.g., when the DFT-enabled FF is not in test mode), when S has a 1 value, the core flip-flop is asynchronously loaded with a 1 value. In this figure, the core flip-flop has active low asynchronous RN and SN pins, while the DFT-enabled FF implements the user-controlled asynchronous reset R and preset S pins as active high signals, because in current common semiconductor technologies, a 2-input NAND gate usually has a smaller area than a 2-input OR gate of equivalent drive. This diagram shows a DFT-enabled FF whose core flip-flop has reset priority, which means the DFT-enabled FF should also implement reset priority.

The test pins are SDI (scan data in), SCLK (scan clock), SE (scan enable), and FREEZE_LOW (freeze—active low). Within a scan chain, the Q of one DFT-enabled FF is connected to the SDI of the next DFT-enabled FF in the scan chain. Some DFT-enabled FF implementations may include a separate SDO (scan data out) pin. In that case, the SDO of one DFT-enabled FF is connected to the SDI of the next DFT-enabled FF in the scan chain.

Figure 3:
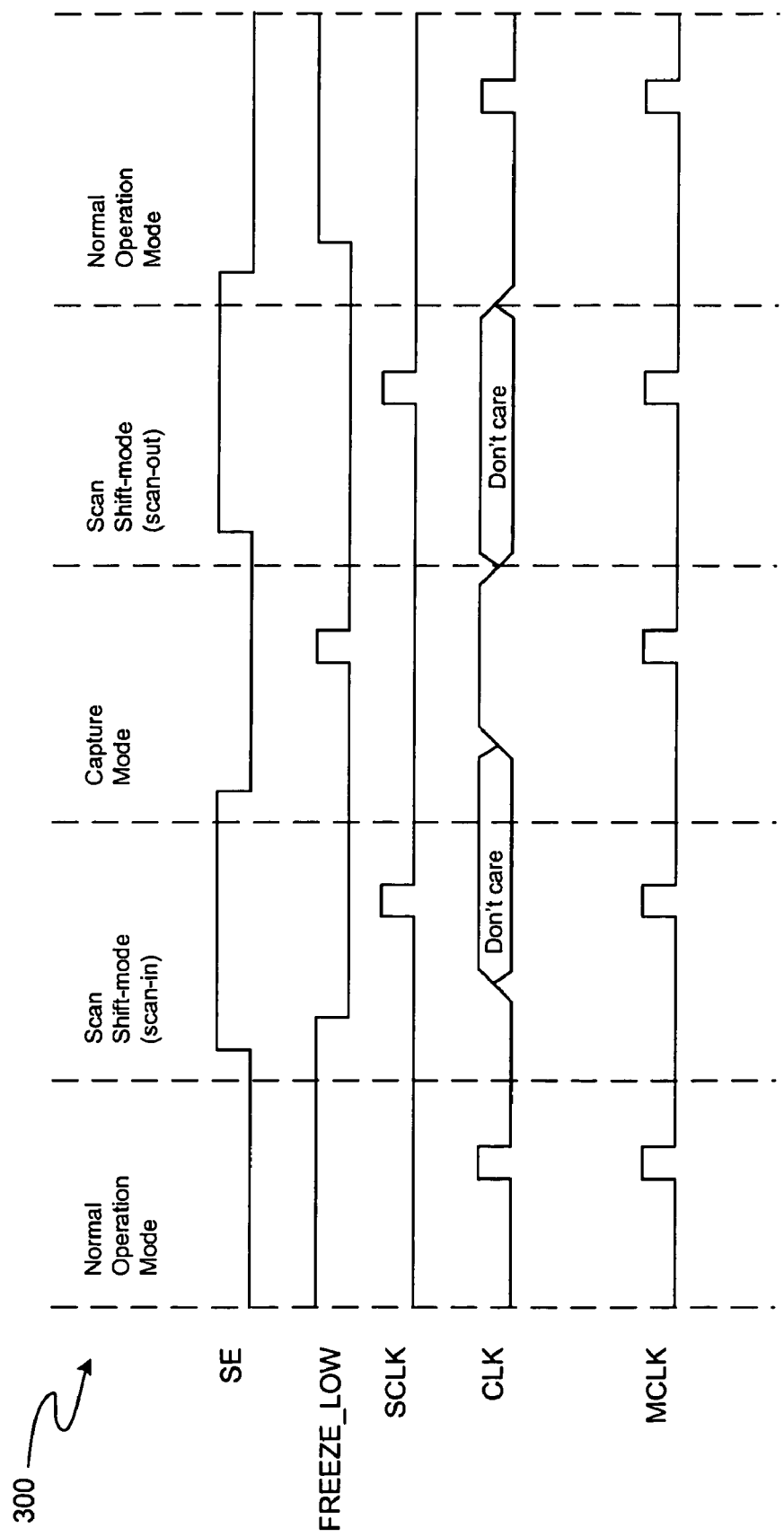
FIG. 3 shows high-level waveforms associated with this DFT-enabled FF's normal operation mode, scan shift mode, and capture mode.

This DFT-enabled FF has 3 modes of operation: normal operation mode, scan shift mode, and capture mode. A typical scan test sequence is: scan-in, capture mode, and scan-out. Circuit defects are detected when the scan-out values do not match the expected values for a good circuit. FIG. 3 shows high-level waveforms associated with this DFT-enabled FF's normal operation mode, scan shift mode, and capture mode. (In a scan chain of N-bit depth, there are N SCLK cycles of scan-in and N SCLK cycles of scan-out.)

When the DFT-enabled FF's SE pin is at a 0 value, and FREEZE_LOW is at a 1 value, the DFT-enabled FF is in normal operation mode.

When the DFT-enabled FF's SE pin is at a 1 value, and FREEZE_LOW is at a 0 value, the DFT-enabled FF is in scan shift mode. During scan shift mode, the asynchronous reset RN and asynchronous preset SN pins on the core flip-flop are forced to a 1 value, independent of the values on R and S. The user pins, D and CLK, are also bypassed—SCLK is used to clock SDI data into the core flip-flop. During scan shift mode, the DFT-enabled FF ensures that the core flip-flop is not affected by normal operation (user circuit) values. In other words, the core flip-flop is "frozen" with respect to user circuit inputs.

As a result, there are no user scan-chain-related DFT rules. This means the designer does not need to add the normally required DFT-related logic into the user circuit to ensure that the scan chains shift correctly. For example:

During scan shift mode, the asynchronous reset RN and asynchronous preset SN pins on the core flip-flop are forced to a 1 value, independent of the values on R and S—which means the designer does not need to add DFT-related logic to block asynchronous preset and reset signals.

During scan shift mode, SCLK (not the user pin CLK) clocks the scan chains—which means the designer does not need to add DFT-related logic which is required when a user circuit has some flip-flops clocked on the rising edge and some flip-flops clocked on the falling edge, multiple clock domains, internally generated clocks (such as clock dividers), and/or gated clocks.

The DFT-enabled FF is in capture mode when the DFT-enabled FF exits scan shift mode and enters capture mode in order to observe values on the DFT-enabled FF's user pins. In this context, exiting scan shift mode is known as "unfreeze" or "unfreezing", while entry into scan shift mode is known as "freeze" or "freezing".

Figure 4:
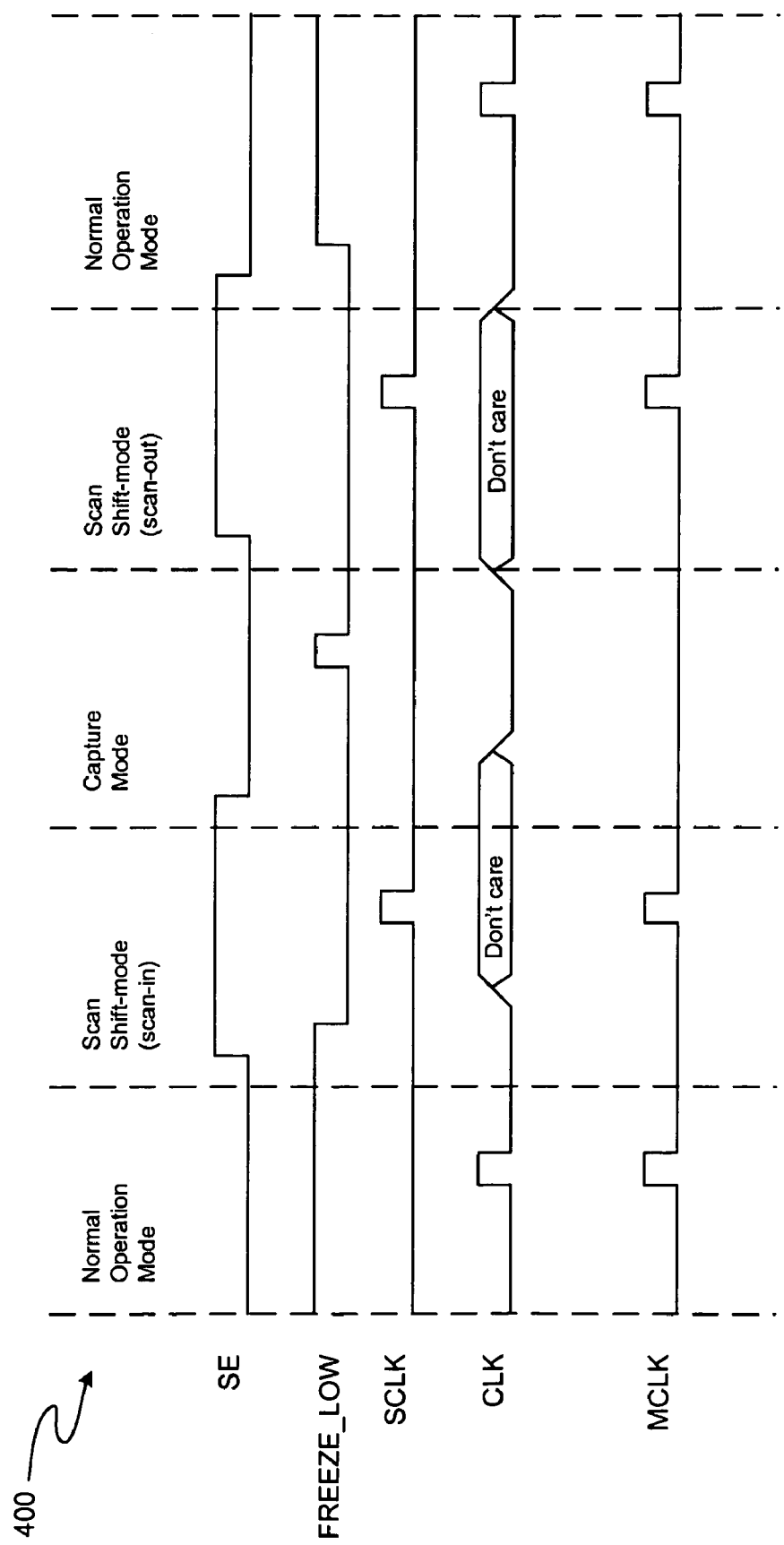
FIG. 4 illustrates setting the DFT-enabled FF's CLK pin to a 0 value when a rising edge at the core flip-flop's CLK pin (MCLK signal) is not desired.

Capture mode can observe user circuit values presented on all user pins (D, CLK, S, and R). As one example, the state of CLK is inferable through manipulation of the SCLK and FREEZE_LOW. When the DFT-enabled FF's SCLK pin is set to a 0 value and the DFT-enabled FF's CLK pin is a 1 value—a rising edge is automatically generated at the core flip-flop's CLK pin when FREEZE_LOW transitions from a 0 value to a 1 value. Since the SE signal is at a 0 value, the core flip-flop clocks in the value presented at its D input. FIG. 3's capture mode waveforms show the rising edge presented to the core flip-flop's CLK pin (MCLK signal). However, if when the DFT-enabled FF's SCLK pin is set to a 0 value, the DFT-enabled FF's CLK pin is a 0 value, then the core flip-flop's CLK pin (MCLK signal) will remain a constant 0 value (regardless of the FREEZE_LOW pulse) as shown in FIG. 4. Inherent in this design, in the presence of a 0 value on the DFT-enabled FF's CLK pin, should the DFT-enabled FF's SCLK pin be set to a 1 value, a rising edge will be presented to the core flip-flop's CLK pin (MCLK signal) when FREEZE_LOW transitions from a 1 value to a 0 value, and the core flip-flop will clock in the value presented at its D input.

Figure 5:
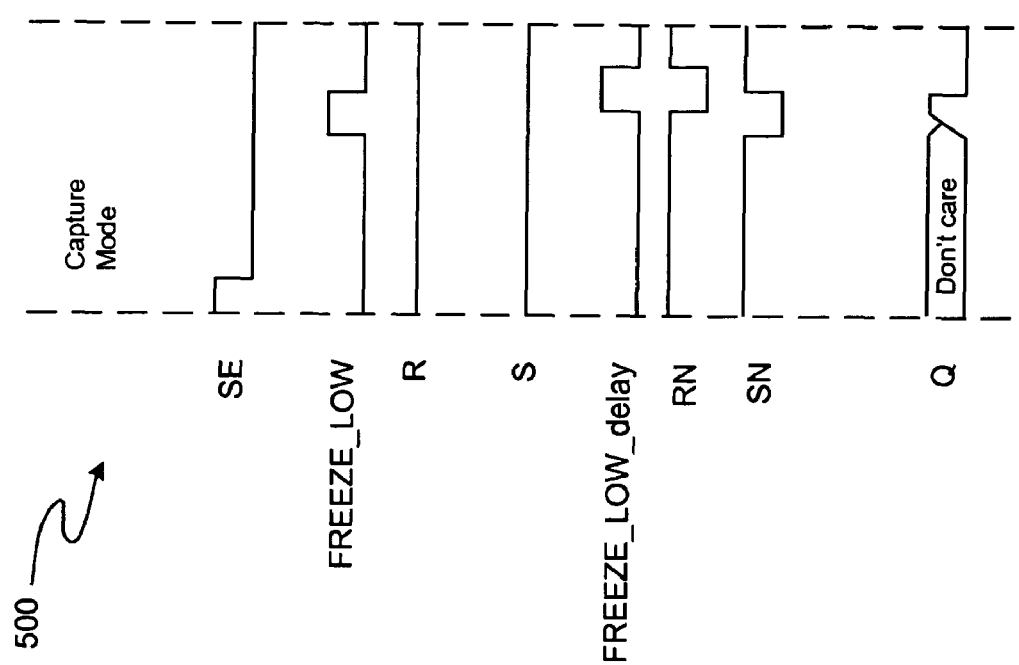
FIG. 5 shows high-level waveforms for capture mode.

During capture mode, the values on the user R and S pins can affect the core flip-flop's value because the FREEZE_LOW signal is strobed true (to a 1 value). The ability to use the single common FREEZE_LOW signal to both enable the R and S pins and also effect the clock (MCLK) to the core flip-flop, reduces the total number of test control signals required. The buffer in the diagram adds sufficient delay to the FREEZE_LOW_delay signal to ensure that if both R and S have a 1 value when the DFT-enabled FF enters capture mode, the core flip-flop will correctly be loaded with a 0 value. FIG. 5 shows high-level waveforms for capture mode—specifically when both R and S have a 1 value, resulting in the core flip-flop with a final capture value of 0 (reset priority).

During capture mode (and of course normal operation), the user circuit's values on the R and S pins control the asynchronous reset and preset behavior of the core flip-flop, which enables these functional paths inside the DFT-enabled FF to be verified.

The ability to observe circuit values presented on all user pins and check functional paths inside the DFT-enabled FF is an advancement in the state of the art.

Figure 6:
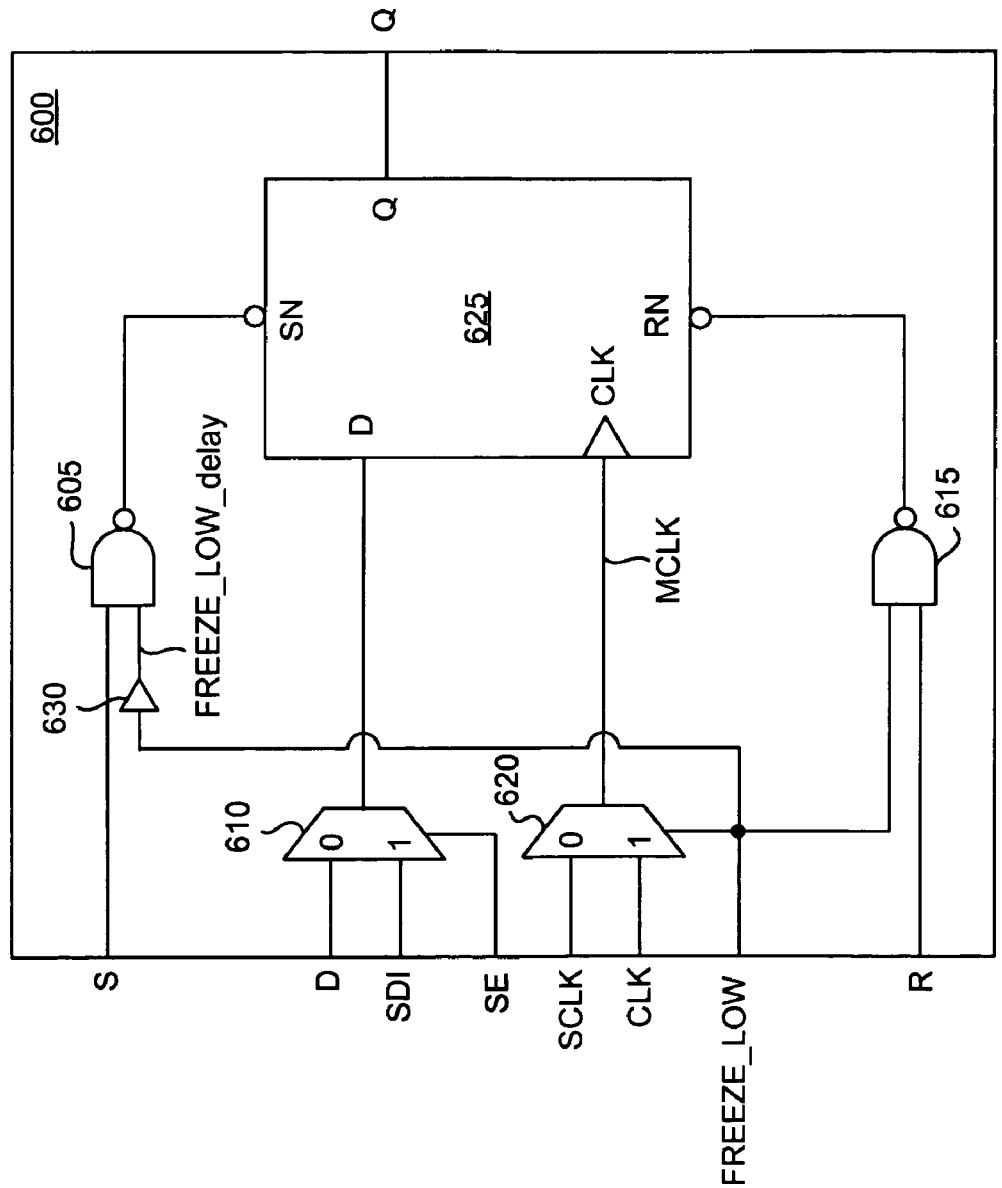
FIG. 6 shows a variation of the DFT-enabled FF.
Figure 7:
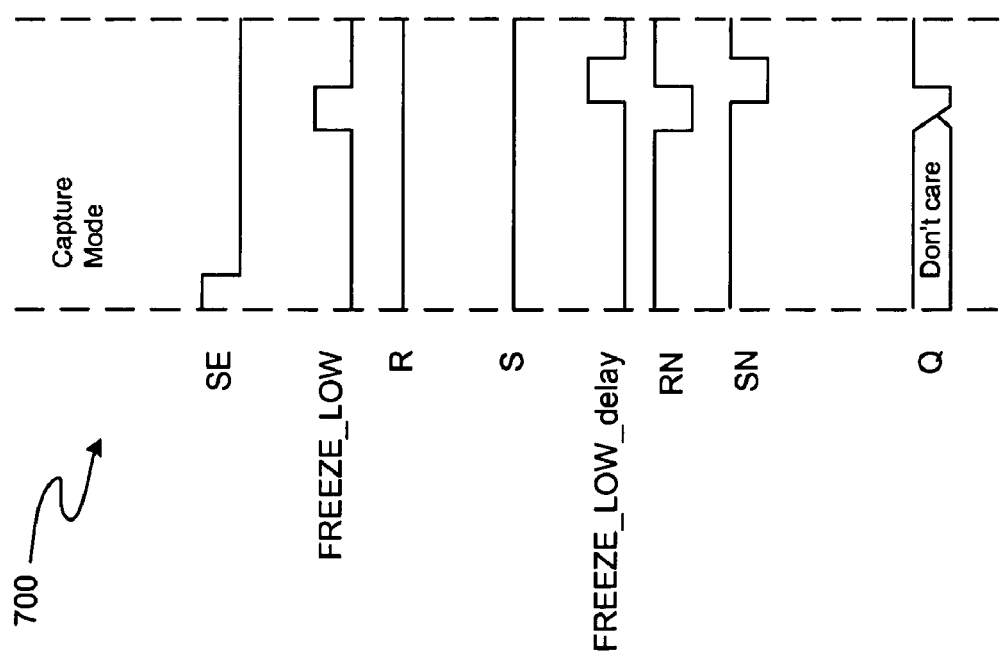
FIG. 7 shows high-level waveforms for capture mode—specifically when both R and S have a 1 value, resulting in the core flip-flop with a final capture value of 1 (preset priority).

FIG. 6 shows a variation of the DFT-enabled FF. The user pins are D, CLK, R, S, and Q. From a user's functional viewpoint (e.g., when the DFT-enabled FF is not in test mode), when R has a 1 value, the core flip-flop is asynchronously loaded with a 0 value. From a user's functional viewpoint (e.g., when the DFT-enabled FF is not in test mode), when S has a 1 value, the core flip-flop is asynchronously loaded with a 1 value. This figure shows a DFT-enabled FF whose core flip-flop has preset priority, which means the DFT-enabled FF should also implement preset priority. The buffer in the diagram adds sufficient delay to the FREEZE_LOW_delay signal to ensure that if both R and S have a 1 value when the DFT-enabled FF enters capture mode, the core flip-flop will correctly be loaded with a 1 value. FIG. 7 shows high-level waveforms for capture mode—specifically when both R and S have a 1 value, resulting in the core flip-flop with a final capture value of 1 (preset priority).

Figure 8:
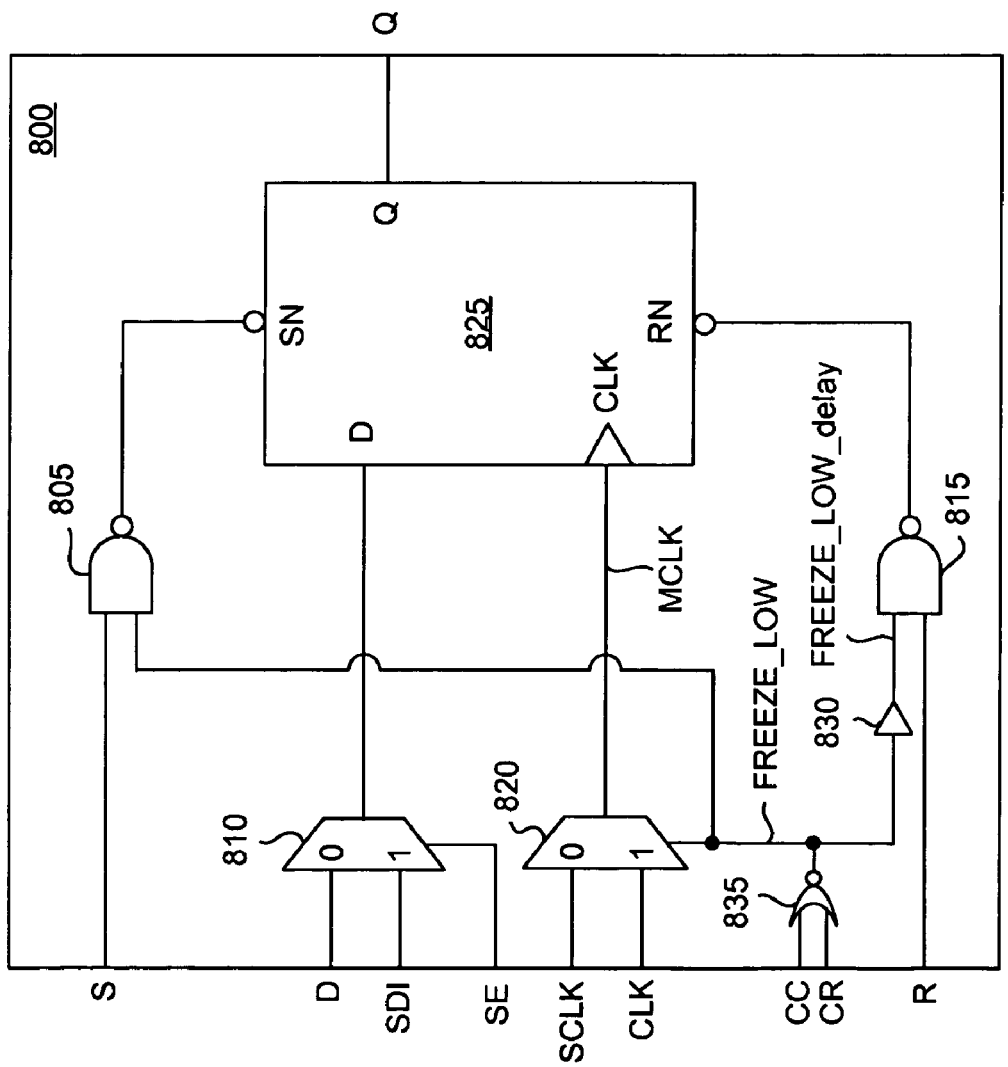
FIG. 8 illustrates adding a NOR gate to the DFT-enabled FF of FIG. 2 as an alternative method of a generating a "FREEZE_LOW-equivalent" signal.
Figure 9:
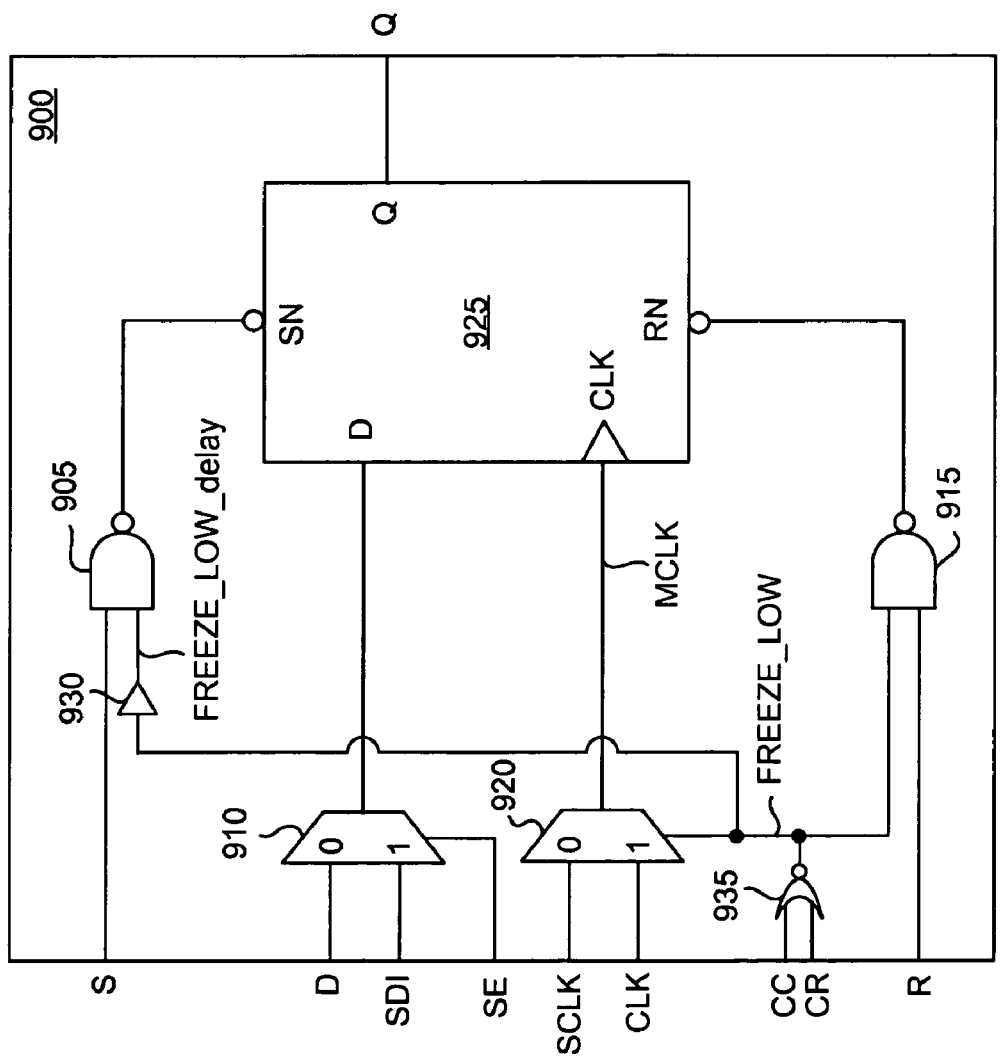
FIG. 9 illustrates adding a NOR gate to the DFT-enabled FF of FIG. 6 as an alternative method of a generating a "FREEZE_LOW-equivalent" signal.
Figure 10:
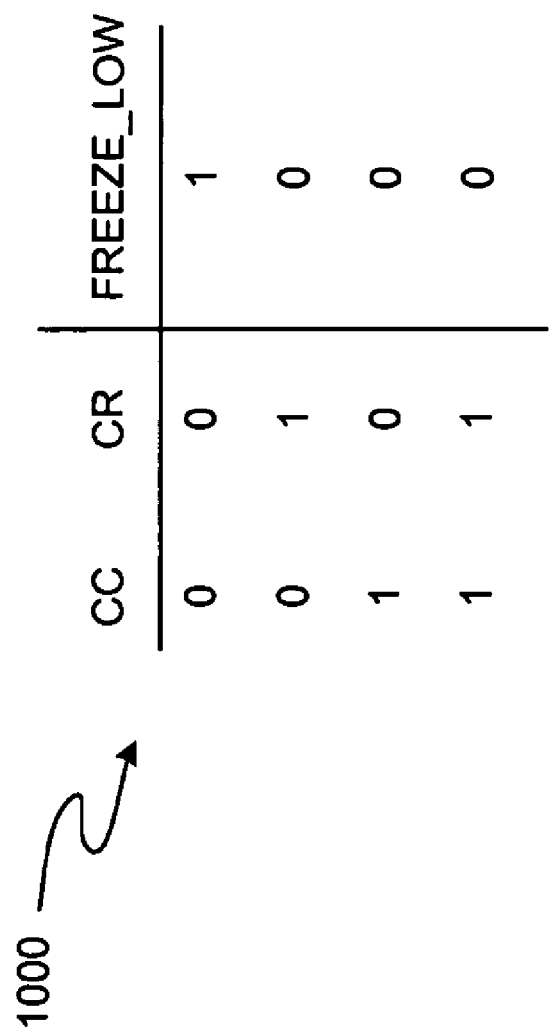
FIG. 10 shows the truth table associated with this implementation—when either or both CC or CR is set to a 1 value, FREEZE_LOW is at a 0 value.

Adding a NOR gate to each DFT-enabled FF as shown in FIGS. 8 and 9 provides an alternative method of a generating a "FREEZE_LOW-equivalent" signal. FIG. 10 shows the truth table associated with this implementation—when either or both CC or CR is set to a 1 value, FREEZE_LOW is at a 0 value. In this case, the test pins are SDI (scan data in), SCLK (scan clock), SE (scan enable), and CC (cut column) and CR (cut row). Using two signals to place the DFT-enabled FF into freeze mode provides a convenient way of addressing (selecting) a sub-set of DFT-enabled FFs, when the DFT-enabled FFs are arrayed in a regular 2-dimensional array. Adding a NOR gate to DFT-enabled simulated latches, DFT-enabled buffers, and DFT-enabled latches also allow them to be mixed with DFT-enabled FFs for arraying in a regular 2-dimensional array.

Figure 11:
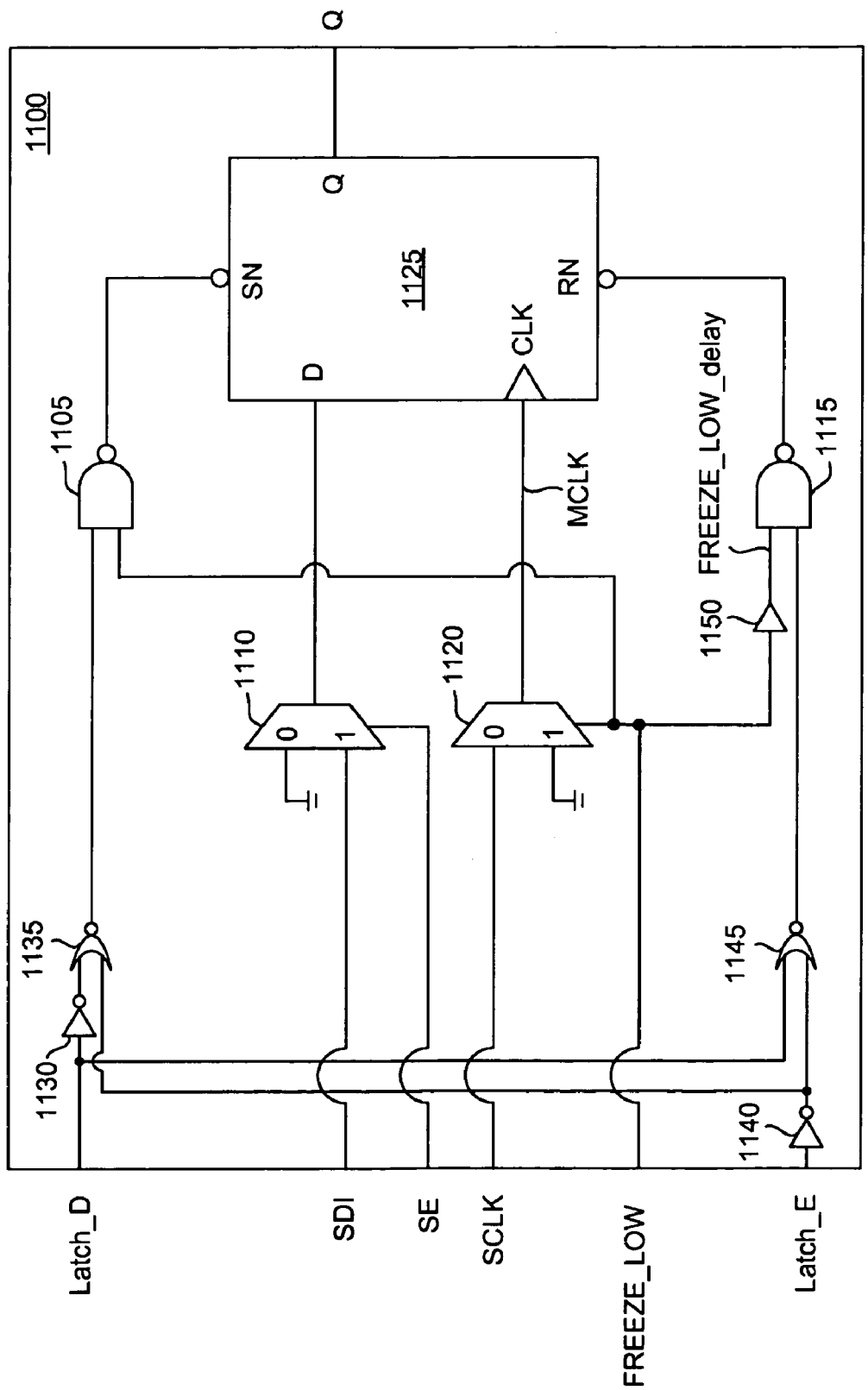
FIG. 11 shows how adding two inverters and 2 NORs to the DFT-enabled FF (previously shown in FIG. 2) allows the DFT-enabled FF to behave as a DFT-enabled latch.

The DFT-enabled FF can also implement latch behavior in a user circuit. FIG. 11 shows how adding two inverters and 2 NORs to the DFT-enabled FF (previously shown in FIG. 2) allows the DFT-enabled FF to behave as a DFT-enabled latch. The user pins are Latch_D, Latch_E, and Q. The test pins remain SDI, SCLK, SE, and FREEZE_LOW. In both normal operation mode and capture mode, when Latch_E has a 1 value, the core flip-flop's value depends on the Latch_D value. When Latch_E has a 0 value, the core flip-flop holds its current value.

Figure 12:
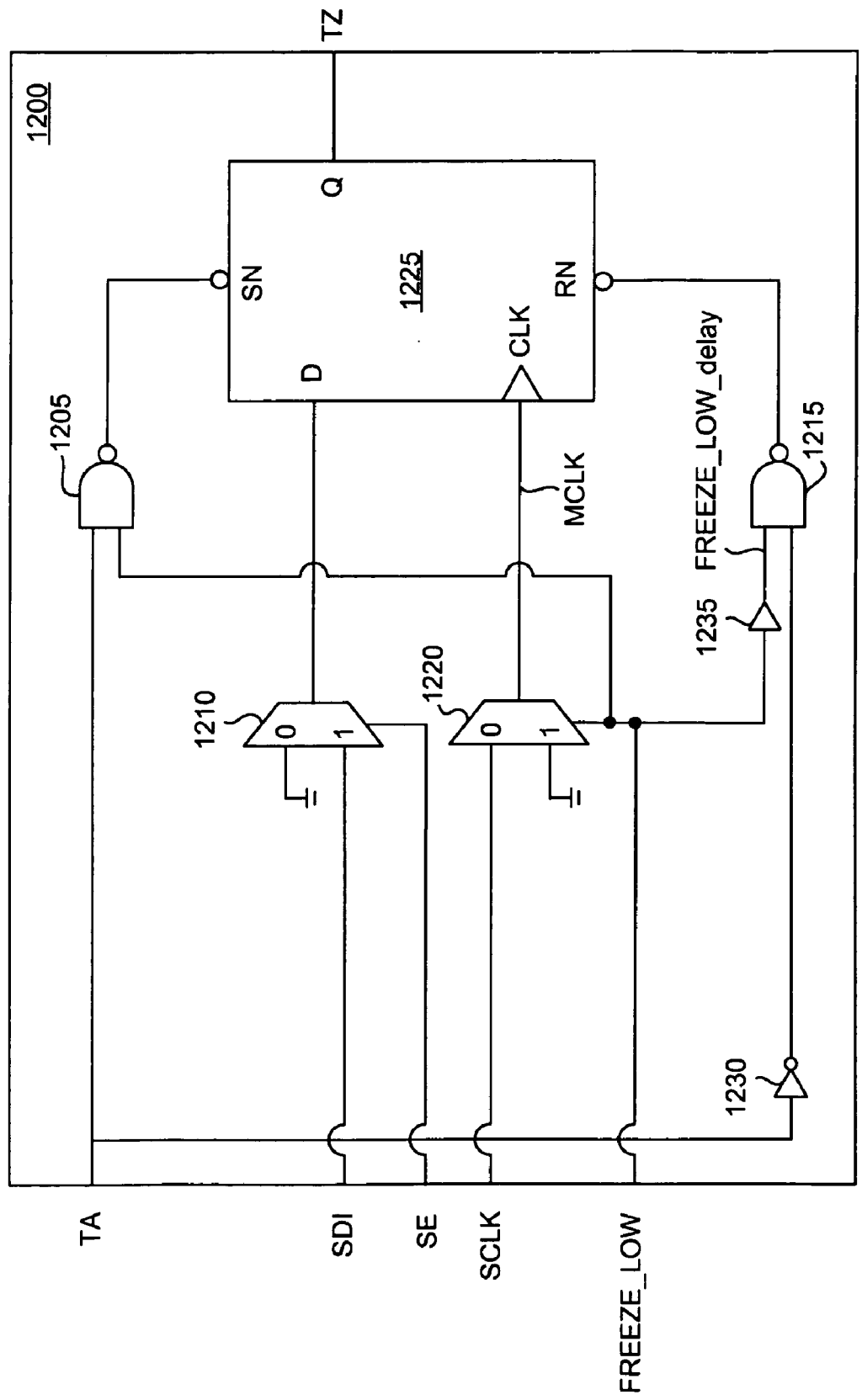
FIG. 12 shows how adding one inverter to the DFT-enabled FF (of FIG. 2) allows the DFT-enabled FF to behave as a DFT-enabled buffer test point.

The DFT-enabled FF can also implement a buffer test point in a user circuit. FIG. 12 shows how adding one inverter to the DFT-enabled FF (previously shown in FIG. 2) allows the DFT-enabled FF to behave as a DFT-enabled buffer test point. The user pins are TA and TZ. The test pins remain SDI, SCLK, SE, and FREEZE_LOW. In both normal operation mode and capture mode, when TA has a 1 value, the core flip-flop's value (and TZ pin) is 1. When TA has a 0 value, the core flip-flop's value (and TZ pin) is 0. DFT-enabled buffer test points are useful increasing the testability of a user circuit's without modifying the user circuit's functionality.

In later discussions, the DFT-enabled FF that implements latch behavior (shown in FIG. 11) will be referred to as a DFT-enabled simulated latch, while the DFT-enabled FF that implements a buffer test point (shown in FIG. 12) will be referred to as a DFT-enabled buffer.

Figure 13:
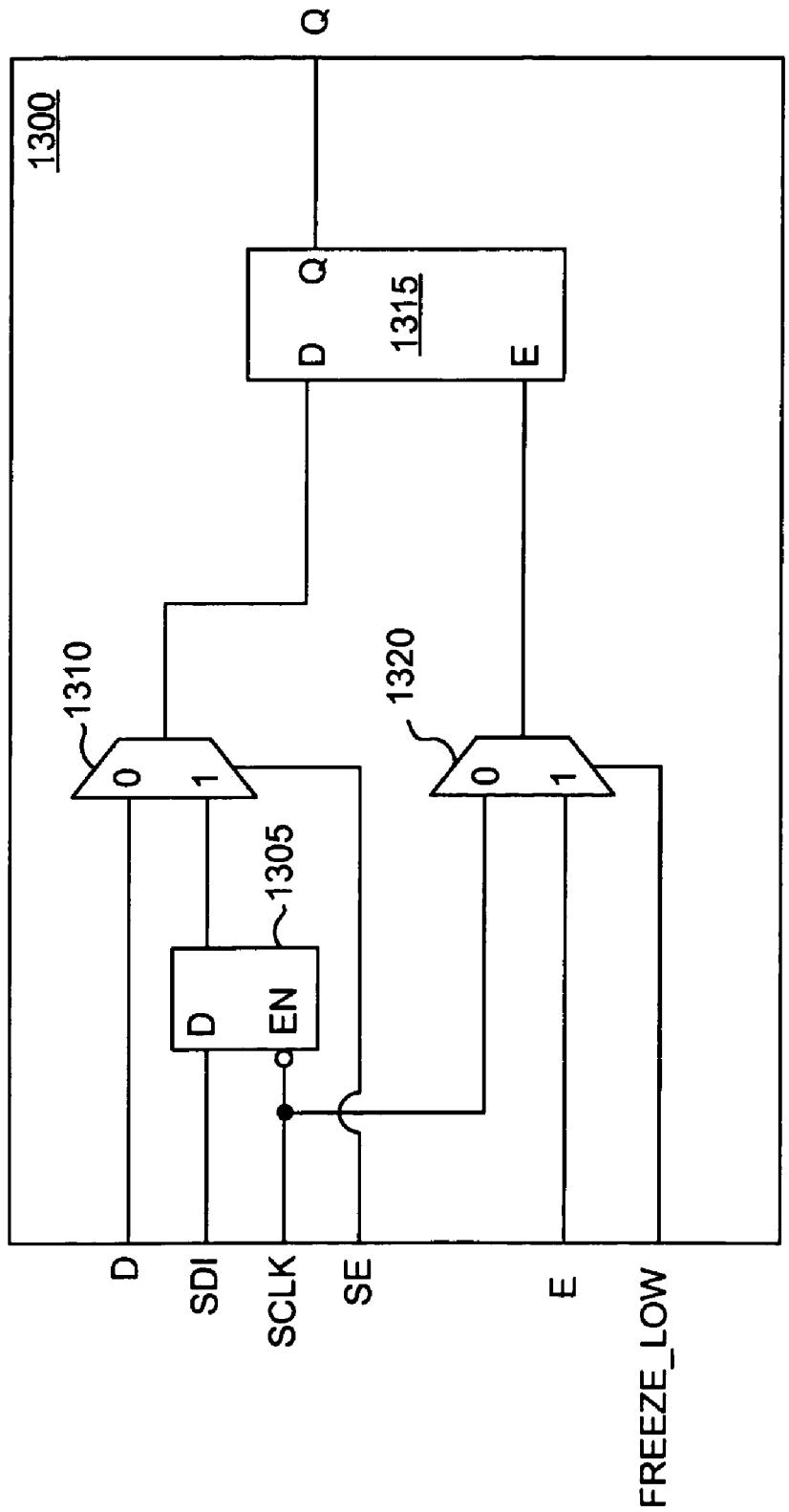
FIG. 13 shows a DFT-enabled latch embodiment that behaves like a flip-flop during scan shift, but behaves like a latch during normal operation and capture mode.

FIG. 13 shows a DFT-enabled latch embodiment that behaves like a flip-flop during scan shift, but behaves like a latch during normal operation and capture mode. The user pins are D, E, and Q. The test pins remain SDI, SCLK, SE, and FREEZE_LOW. DFT-enabled FFs and DFT-enabled latches can be placed within the same scan chain. If the user pin E is tied high, then the DFT-enabled latch can be used as a DFT-enabled buffer.

Embodiments are envisioned that consolidate some of the DFT-enabled FF's logic into integrated cells. As an example, a mux-scan flip-flop or mux flip-flop can be used instead of a discrete mux and flip-flop. Other envisioned embodiments consolidate all of the DFT-enabled FF's logic into one integrated cell.

Also, the DFT-enabled FFs may be implemented with only an asynchronous reset, or with only an asynchronous preset, or without any asynchronous reset or preset. In those cases, the appropriate NAND gate(s) and buffer would not be required and can be removed as an optimization. The muxes shown in FIGS. 11 and 12 can also be removed as an optimization.

DFT-Enabled Flip-Flop Use in Partition Test

Figure 14:
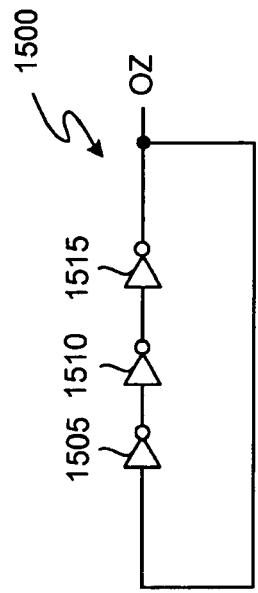
FIG. 14 is the first of two examples of unstable circuits.
Figure 15:
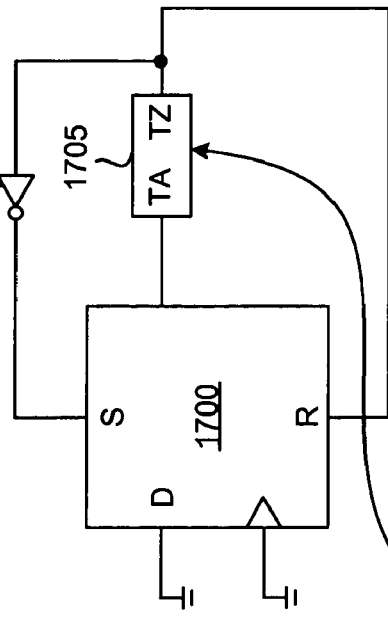
FIG. 15 shows another example of a non-deterministic circuit—in this case, a ring oscillator.

Embodiments are next described where the DFT-enabled FF, DFT-enabled simulated latch, DFT-enabled buffer, or DFT-enabled latch circuits are combined with addressable control and partition test. This testing method can test user circuits without requiring complex DFT rules or any user-inserted test structures. This testing method can also test "unstable" circuits; two examples of unstable circuits are shown in FIGS. 14 and 15. These circuits are usually considered non-deterministic and untestable from a normal scan test perspective.

In FIG. 14, the flip-flop oscillates between 0 to 1 and 1 to 0. To simplify the diagram, only the flip-flop's user pins are shown because this scenario applies to flip-flops in general. If the flip-flop output has a 0 value, then the asynchronous preset S pin is asserted and the flip-flop is loaded with a 1 value. If the flip-flop output has a 1 value, then the asynchronous reset R pin is asserted and the flip-flop is loaded with a 0 value. A known value can be scanned into the flip-flop. However, the capture (observed) value for this flip-flop is not deterministic because of speed variations caused by manufacturing, temperature and voltage.

FIG. 15 shows another example of a non-deterministic circuit—in this case, a ring oscillator. The value of OZ switches from 0 to 1 and 1 to 0. The value of OZ at a specific time X after power is applied to the circuit is non-deterministic because the initial conditions at power up cannot be controlled sufficiently. If OZ is driving a flip-flop's user clock pin, then that flip-flop's value at time X also cannot be determined, which means the capture (observed) value for this flip-flop is also non-deterministic.

To help ensure deterministic capture values, a concept known as "loop breaking" is introduced. First, component types within a circuit assigned into three different categories: 0_break, 1_break, and 2_break. For counting purposes, 0_breaks are ignored, while two 1_breaks is equivalent to one 2_break.

All combinational cells are 0_break cells. DFT-enabled simulated latches (FIG. 11), DFT-enabled buffers (FIG. 12), and DFT-enabled latches (FIG. 13) are 1_break cells. DFT-enabled FFs are 1_break cells, when encountered through their user asynchronous preset or reset pins. DFT-enabled FFs are 2_break cells, when encountered through their user clock or D pin.

Figure 16:
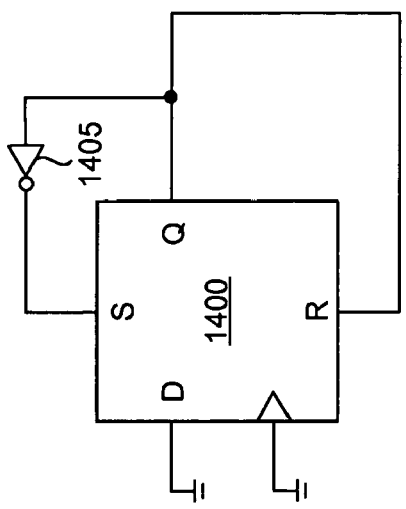
FIG. 16 shows how two DFT-enabled buffers break the loop, without affecting the user circuit's functionality—the user circuit still oscillates.
Figure 17:
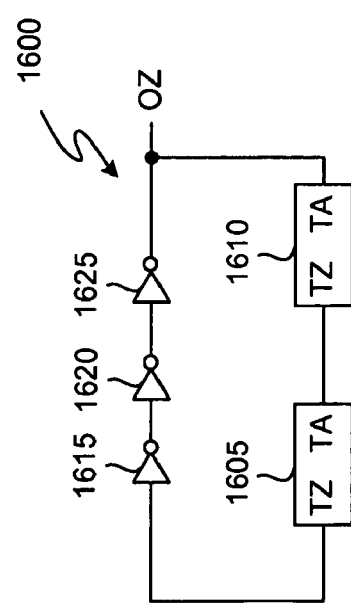
FIG. 17 shows how one DFT-enabled buffer breaks a loop, without affecting the user circuit's functionality—the user circuit still oscillates.

To detect loops, the entire user circuit is traversed using graph traversal techniques (that are generally known in the art), while keeping track of the number of "breaks" encountered. A loop is detected, if a cycle exists (i.e., a node is visited more than once) and the number of breaks is less than two. If the number of breaks is zero, then insert two DFT-enabled buffers to break the loop. FIG. 16 shows how two DFT-enabled buffers break the loop, without affecting the user circuit's functionality—the user circuit still oscillates. If the number of breaks is one, then insert one DFT-enabled buffer to break the loop. FIG. 17 shows how one DFT-enabled buffer breaks a loop, without affecting the user circuit's functionality—the user circuit still oscillates. To simplify FIGS. 16 and 17 only the user pins from each DFT-enabled buffer is shown. FIG. 16 also shows only the user pins of the DFT-enabled FF. By inserting DFT-enabled buffers, unstable circuits now have deterministic capture values and are also more testable.

As discussed earlier, when the DFT-enabled FF unfreezes, it becomes sensitive to the values on the user pins. The DFT-enabled simulated latch, DFT-enabled buffer, and DFT-enabled latch also become sensitive to values on the user pins when they unfreeze.

For the remaining discussion, unless otherwise specified, all concepts and capabilities attributed to the DFT-enabled FF, also apply to the DFT-enabled simulated latch, DFT-enabled buffer, and DFT-enabled latch.

If all the DFT-enabled FFs in a design were unfrozen simultaneously, the values captured into DFT-enabled FFs depend on the order that each DFT-enabled FF unfreezes. Two flawless circuits, both implementing the same user-designed circuit, may have speed differences that cause each chip to capture different values.

To ensure that speed differences do not result in non-deterministic values being captured, the following partition test steps are taken:
 Identify and break all loops in the user-designed circuit;
 Divide the user-designed circuit into partitions; and
 Test the user-designed circuit one partition at a time.
DFT-enabled FFs are divided into partitions using the following approach:
 DFT-enabled FFs that are "adjacent" cannot be in the same partition.
 Two DFT-enabled FFs are considered "adjacent" if the output from one will influence the state of the other. For example, two DFT-enabled FFs are adjacent if (1) there are connection lines directly from the Q output of one DFT-enabled FF to any user pin on the second DFT-enabled FF or (2) there is connection as described in (1) but with additional interposition of combinational logic only.
 Partitions are determined by graph coloring techniques that are generally known in the art.

When a partition is being tested, the DFT-enabled FFs within the tested partition can enter capture mode, while the DFT-enabled FFs in all other partitions must remain frozen. By testing the user circuit one partition at a time (i.e., only one partition is placed into capture mode at a time), capture values no longer depend on the order that each DFT-enabled FF unfreezes. In other words, partition test guarantees deterministic capture values.

Addressable control is a method of that enables DFT-enabled FFs (of the type described herein) to be selected individually, in groups, or in entirety to operate in normal operation mode, scan shift mode, and capture mode. The address selection can be pre-designed or can be hard-wired.

One approach of a pre-designed addressing scheme utilizes row and column addressing, where each DFT-enabled FF is assigned a unique row and column address. Row and column addressing would be efficient in a logic array or gate array. Row and column addressing enables testing of any user-designed circuit that can implemented in the logic array (or gate array); prior knowledge of the user-designed circuits is not required.

Figure 18:
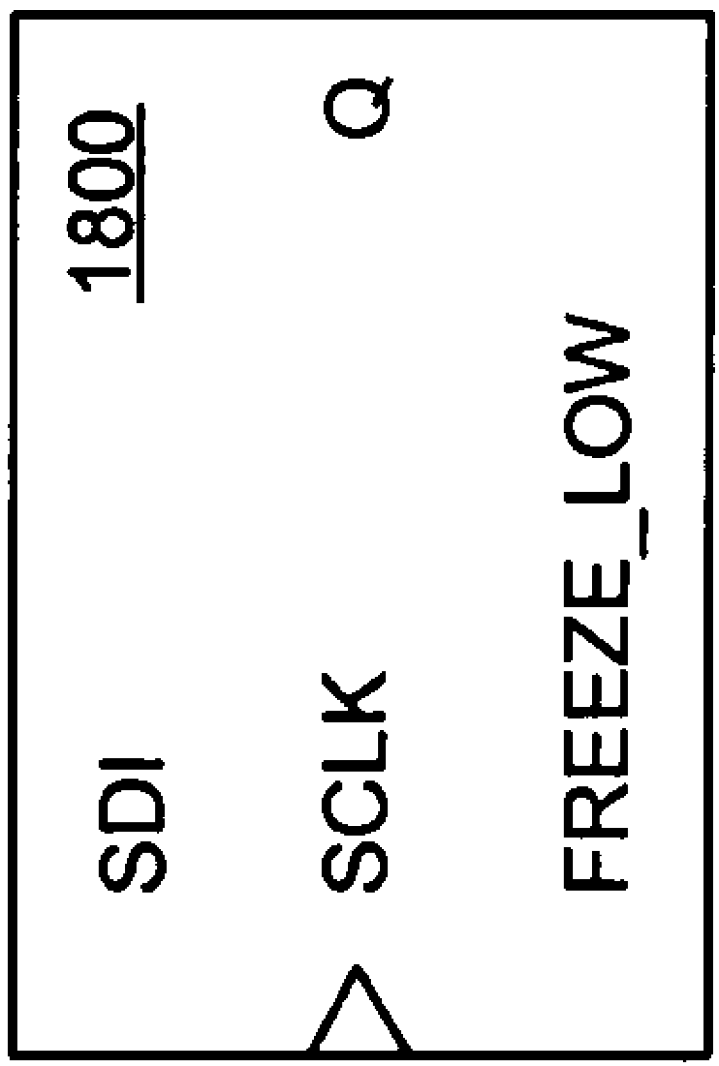
FIG. 18 shows a simplified diagram of a DFT-enabled FF—with the following test pins SDI, SCLK, FREEZE_LOW and the output pin Q is shown.

FIG. 18 shows a simplified diagram of a DFT-enabled FF—with the following test pins SDI, SCLK, FREEZE_LOW and the output pin Q is shown. The test pin SE and the user pins are not shown.

Figure 19:
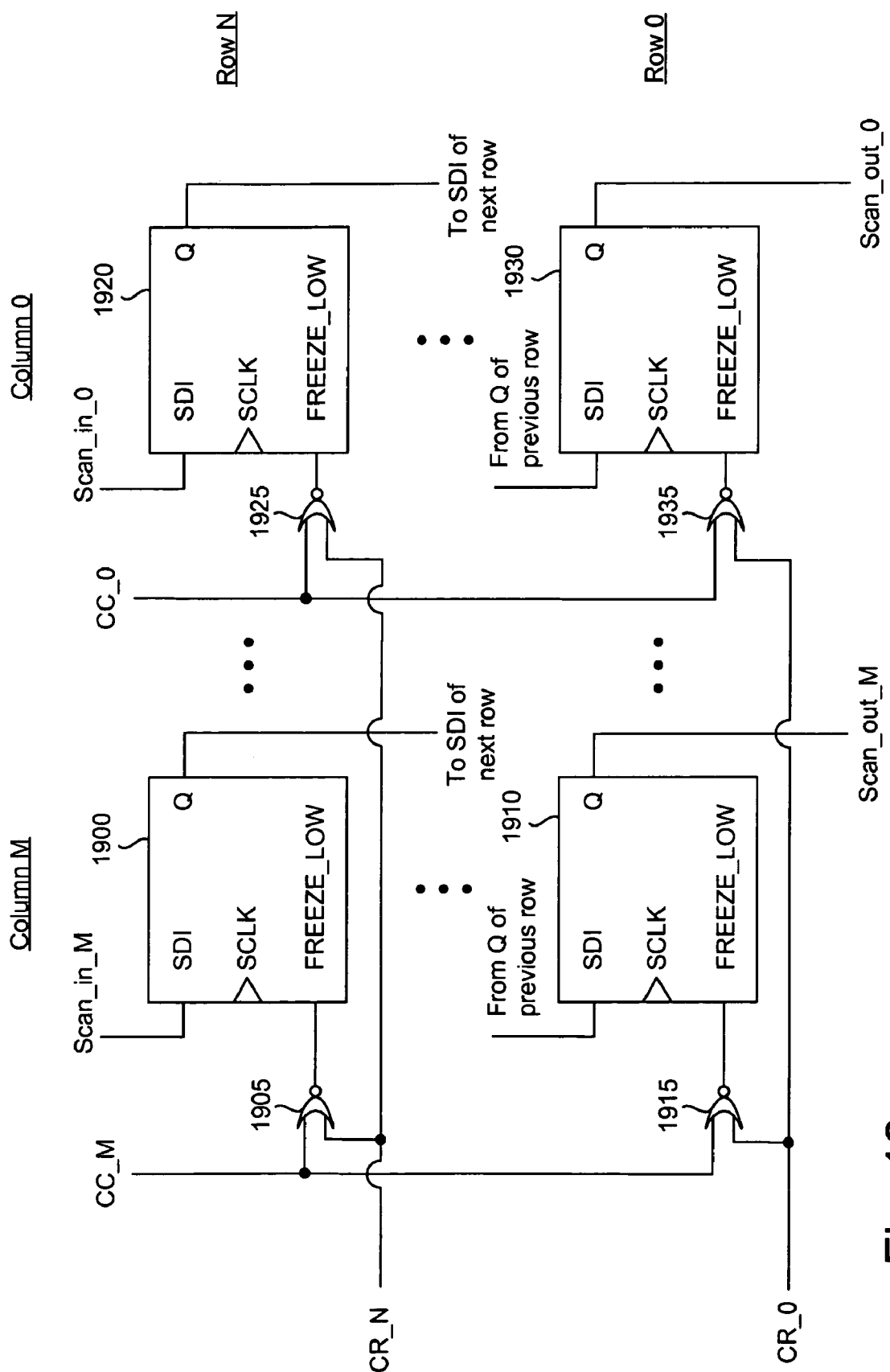
FIG. 19 shows how the simplified DFT-enabled FFs (of FIG. 18) can be placed in a two-dimension array and selected using row and column addressing.

FIG. 19 shows how the simplified DFT-enabled FFs (of FIG. 18) can be placed in a two-dimension array and selected using row and column addressing. In this example, there are M+1 columns (numbered right to left: 0 to M) and there are N+1 rows (numbered bottom to top: 0 to N). The DFT-enabled FFs in a column are connected into scan chains. In this example, there are M+1 scan chains. Each column has its own column select line (numbered from right to left: CC_0 to CC_M), while each row has its own row select line (numbered from bottom to top: CR_0 to CR_N).

In FIG. 19, a row is frozen by setting that row's select line to a 1 value, while a column is frozen by setting that column's select line to a 1 value. A DFT-enabled FF is frozen when either or both of its row select line or column select lines is at a 1 value. FIGS. 8 and 9 show two examples of DFT-enabled FFs that are compatible with this row and column addressing method. In this case, each DFT-enabled FF's CC test pin would be connected to the appropriate column select line, and each DFT-enabled FF's CR test pin would be connected to the appropriate row select line.

By using the row and column select lines, DFT-enabled FFs can be addressed (frozen or unfrozen) individually, in groups, or in entirety. When a partition is being tested, only the DFT-enabled FFs in that partition can be selected to enter capture mode.

When DFT-enabled FFs are not arranged in rows and columns—for example, in a standard cell ASIC—hard-wired addressing can be used to select individual, groups or all of the DFT-enabled FFs in the user-designed circuit. Hard-wired addressing requires prior knowledge of the user-designed circuit. The DFT-enabled FFs in the user-designed circuit are divided into partitions. Each partition requires a separate and distinct FREEZE_LOW signal. All the DFT-enabled FFs in a given partition share the same FREEZE_LOW signal. During scan shift mode, every partition's FREEZE_LOW has a 0 value. During capture mode, only one partition's FREEZE_LOW switches between 0 to 1 to 0 values.

DFT-Enabled Flip-Flop with Output Freeze

Figure 20:
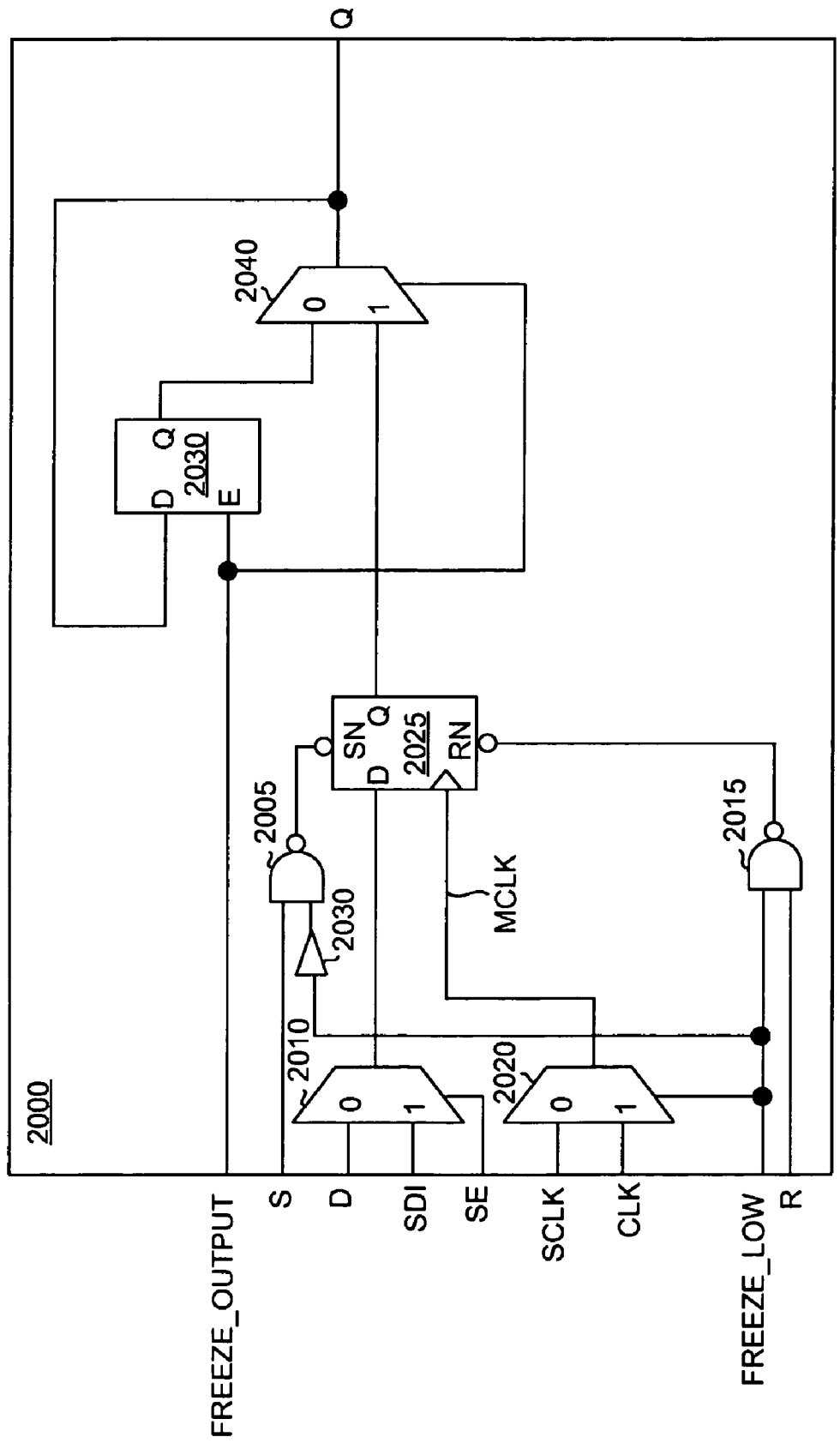
FIG. 20 illustrates a DFT-Enabled FF that eliminates the need for partitioning circuits, simplifies loop breaking, and reduces the vector count required to test circuits.

FIG. 20 illustrates a DFT-Enabled FF 2000 that eliminates the need for partitioning circuits, simplifies loop breaking, and reduces the vector count required to test circuits. The Nor gate 935 that is used to generate FREEZE_LOW from CC and CR in the DFT-Enabled FF 900 of FIG. 9 is eliminated, and instead a single freeze_low signal is brought into the cell 2000. The output of flip flop 2025 is run through 2-1 mux 2040 that is controlled by a new signal called freeze_output. The other input of the mux 2040 is connected to the output of latch 2030 which has it's D input connected to the output of the new mux 2040 and it's enable input connected to the freeze_output signal.

Figure 21:
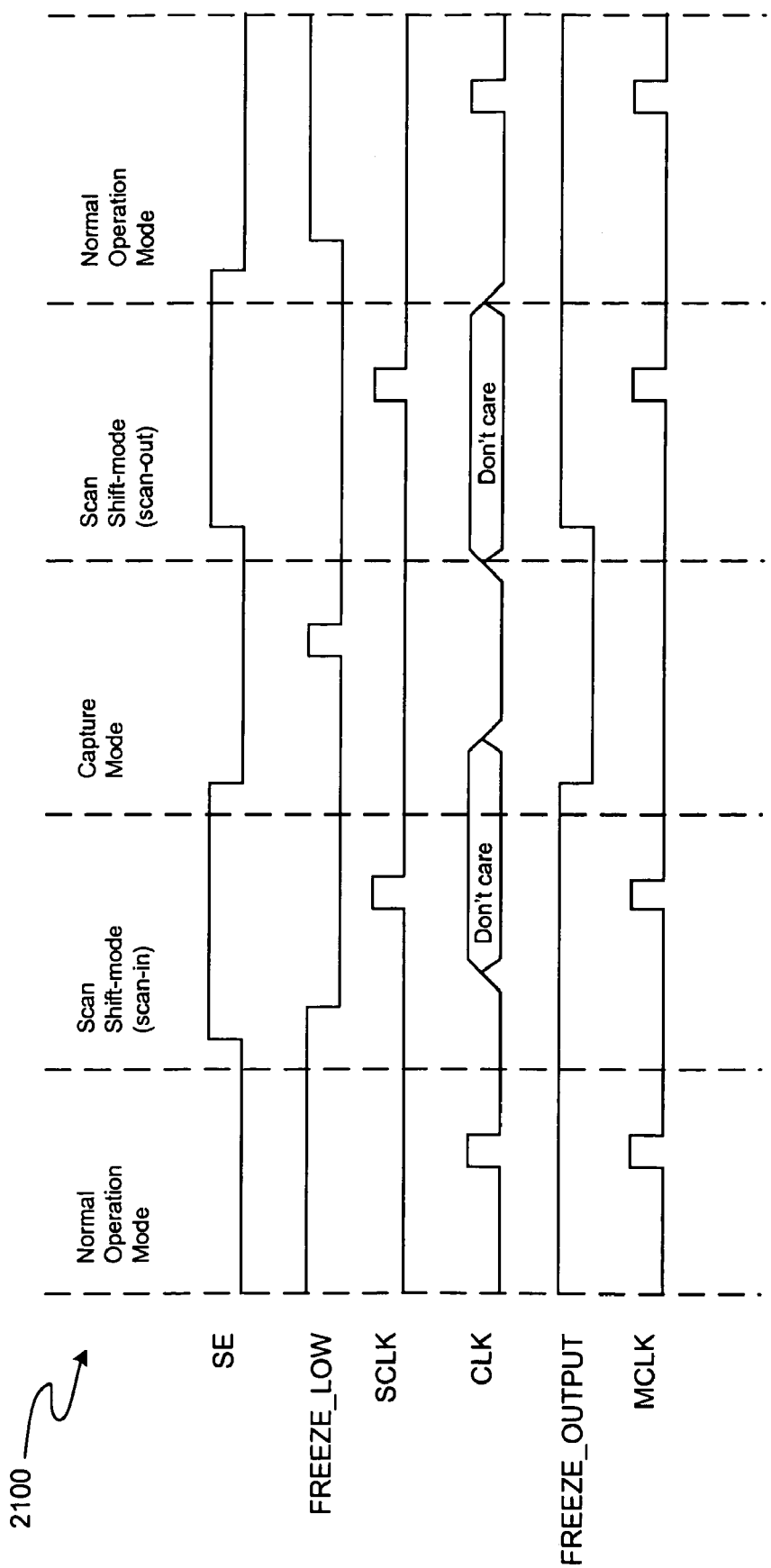
FIG. 21 illustrates the timing of the DFT-Enabled FF of FIG. 20.

FIG. 21 illustrates the timing of the DFT-Enabled FF 2000 of FIG. 20. In contrast to the timing of FIG. 4, during normal operation and scan_shift_mode the freeze output line is held high, and during the Capture mode cycle freeze_output is low and encloses the freeze_low pulse.

Recall that with the DFT-Enabled FF 900 of FIG. 9, adjacent FFs are partitioned into separate logic cones to insure that testing in a first partition does not inadvertently alter the state of the adjacent FFs. The separate partitions are tested in respectively separate test cycles. The DFT-Enabled FF 2000 of FIG. 20 allows partitioning to be eliminated because it effectively freezes the driving stimulus to "adjacent" FFs while the FF outputs are captured. Since partitioning is no longer required, individual CC and CR lines are no longer needed to select which partitions are in capture mode. The CC and CR lines are replaced with one freeze_low line. Furthermore, since there are no partitions, every flop can be captured during each test cycle, reducing test vector counts.

Loop breaking also gets simpler when using the DFT-Enabled FF 2000 of FIG. 20, because now a flip flop that feeds back to it's own set or reset pin is not a problem and does not need a loop breaking element added. Pure combinational loops must be still broken but they only require a single loop breaking element under all circumstances.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (i.e., the callouts or numerical designators) used to identify and reference the features and elements of the embodiments.

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications, are merely those of the described embodiments, are expected to track improvements and changes in implementation technology, and should not be construed as limitations.

Functionally equivalent techniques known in the art are employable instead of those described to implement various components, sub-systems, functions, operations, routines, and sub-routines. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design comprise insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method for designing an integrated circuit, the method comprising:
mapping, by a computing apparatus, a gate-level netlist onto a target implementation architecture of at least a portion of an integrated circuit including implementing a storage function of the gate-level netlist via a respective logic block having integral design-for-testability (DFT) functionality, wherein said logic block comprises:
a D-type flip-flop including a first output, a first data input, and a first clock input, wherein the first data input is selectively coupled to one of a user data input or a scan data input, and wherein the first clock input is selectively coupled to one of a core clock input or a scan clock input;
a D-type latch having a second output, a second data input coupled to a third output of the logic block, and a third input coupled to an enable signal; and
an output selector configured to receive the first output and the second output and to selectively output the third output based on the enable signal.

2. The method of claim 1, wherein said mapping comprises implementing, by the computing apparatus, function blocks of a logic array of the target implementation architecture using a standard cell library, and wherein the logic array includes a base array portion of at least one pre-designed lower layer and at least one customizable upper layer.

3. The method of claim 1, wherein the logic block is a DFT-enabled flip-flop.

4. The method of claim 1, wherein the logic block is a DFT-enabled latch.

5. The method of claim 1, further comprising:
coupling, in a user mode, the core clock input to the first clock input and the user data input to the first data input; and
coupling, in a test mode, the scan clock input to the first clock input and the scan data to the first data input.

6. A logic block having integral design-for-testability functionality, the logic block comprising:
a D-type flip-flop including a first output, a first data input, and a first clock input, wherein the first data input is selectively coupled to one of a user data input or a scan data input, and wherein the first clock input is selectively coupled to one of a core clock input or a scan clock input;
a D-type latch having a second output, a second data input coupled to a third output of the logic block, and a third input coupled to an enable signal; and an output selector configured to receive the first output and the second output and to selectively output the third output based on the enable signal.

7. The logic block of claim 6, wherein the scan chain is implemented by a coupling of a third output of a first instance of the logic block to a scan data input of a second instance of the logic block.

8. The logic block of claim 7, further comprising:
an input selector configured to select between the user data input and the scan data input as a function of a first control input and to drive the first data input; and
a clock-input selector configured to select between the core clock input and the scan clock input as a function of a second control input and to drive the first clock input;
wherein corresponding first and second control inputs of the first and second instances of the logic block of the scan chain are logically identical and are configured to operate in a user mode when the first control input is set to the user data input and the second control input is set to the core clock input.

9. The logic block of claim 8, wherein the first and second instances of the logic block of the scan chain are configured to operate in a shift sub-mode of a test mode when the first control input is set to the scan data input and the second control input is set to the scan clock input.

10. The logic block of claim 6, further comprising:
an input selector configured to select between the user data input and the scan data input as a function of a first control input and to drive the first data input; and
a clock-input selector configured to select between the core clock input and the scan clock input as a function of a second control input and to drive the first clock input;
wherein the output selector is further configured to select between the first output and the second output as a function of a third control input;
wherein the first and second instances of the logic block of the scan chain operate in a capture sub-mode of a test mode when the first control input is set to the user data input and the third control input is set to the second output; and
wherein the logic block is configured such that a capture result of the first instance of the logic block does not influence a capture result of the second instance of the logic block.

11. The logic block of claim 10, wherein in the capture sub-mode, the user data input is configured to be selectively clocked into the D-type flip-flop as a function of the scan clock input, the core clock input, and the second control input.

12. The logic block of claim 10, wherein the D-type flip-flop further comprises a core asynchronous set input and a core asynchronous reset input, and wherein the logic block further comprises:

set gating logic configured to generate a first asynchronous control signal to drive the core asynchronous set input active when an asynchronous set input and the second control input are both in an active state; and
reset gating logic configured to generate a second asynchronous control signal to drive the core asynchronous reset input active when an asynchronous reset input and the second control input are both in an active state;
wherein the asynchronous set input and the asynchronous reset input are configured to be effectual only in a user mode and the capture sub-mode.

13. The logic block of claim 12, further comprising at least one delay element configured to provide a falling-edge skew between the first asynchronous control signal and the second asynchronous control signal if the first asynchronous control signal and the second asynchronous control signal are simultaneously driven active.

14. The logic block of claim 6, wherein:
in a user mode, the core clock input is coupled to the first clock input and the user data input is coupled to the first data input; and
in a test mode, the scan clock input is coupled to the first clock input and the scan data is coupled to the first data input.

15. A method for operating a logic block having integral design-for-testability functionality, the method comprising:
outputting, to an output selector, a first output from a D-type flip-flop of the logic block having a first data input selectively coupled to one of a user data input or a scan data input, and having a first clock input clocked by one of a core clock input or a scan clock input;
outputting, to the output selector, a second output from a D-type latch having a second data input coupled to a third output of the logic block and having a third input coupled to an enable signal; and
selectively outputting, by the output selector, the third output based on the enable signal.

16. The method of claim 15, wherein said selectively outputting comprises selectively outputting the third output for detecting, by the computing apparatus, the presence of a fault.

17. The method of claim 15, further comprising coupling a third output of a first instance of the logic block to a scan data input of a second instance of the logic block to form a scan chain.

18. The method of claim 15, further comprising:
coupling, in a user mode, the core clock input to the first clock input and the user data input to the first data input; and
coupling, in a test mode, the scan clock input to the first clock input and the scan data to the first data input.

* * * * *

UNITED STATES PATENT AND TRADEMARK OFFICE
CERTIFICATE OF CORRECTION

| | | |
|---|---|---|
| PATENT NO. | : 8,122,413 B2 | Page 1 of 1 |
| APPLICATION NO. | : 12/303938 | |
| DATED | : February 21, 2012 | |
| INVENTOR(S) | : Hom et al. | |

It is certified that error appears in the above-identified patent and that said Letters Patent is hereby corrected as shown below:

Column 1, lines 7-8, delete "351 U.S.C. § 371 of, International" and insert -- 35 U.S.C. § 371 of International --.

Signed and Sealed this
Fourteenth Day of August, 2012

David J. Kappos
*Director of the United States Patent and Trademark Office*